United States Patent [19]
Jeon et al.

[11] Patent Number: 6,124,202
[45] Date of Patent: Sep. 26, 2000

[54] METHODS OF FABRICATING SILICIDE LAYERS AND SILICIDE CONTACT STRUCTURES IN MICROELECTRONIC DEVICES

[75] Inventors: Jin-ho Jeon, Seoul; Won-ju Kim, Kyungki-do, both of Rep. of Korea

[73] Assignee: Samsung Electronics Co., Rep. of Korea

[21] Appl. No.: 09/010,862

[22] Filed: Jan. 22, 1998

[30] Foreign Application Priority Data

Apr. 30, 1997 [KR] Rep. of Korea ............ 97-16814

[51] Int. Cl.[7] ........................... H01L 21/4763
[52] U.S. Cl. ................... 438/649; 438/680; 438/682
[58] Field of Search .................. 438/649, 680, 438/683, 682

[56] References Cited

U.S. PATENT DOCUMENTS

| | | | |
|---|---|---|---|
| 4,629,635 | 12/1986 | Brors | 427/255.2 |
| 5,231,056 | 7/1993 | Sandhu . | |
| 5,635,765 | 6/1997 | Larson | 257/768 |

FOREIGN PATENT DOCUMENTS

| | | |
|---|---|---|
| 97-060371 | 8/1997 | European Pat. Off. . |
| 63-120419 | 5/1988 | Japan . |
| 9-298169 | 11/1997 | Japan . |

OTHER PUBLICATIONS

Notice of Office Action, Korean Application No. 10–1997–0016814, Jul. 27, 1999.

*Primary Examiner*—Caridad Everhart
*Attorney, Agent, or Firm*—Myers Bigel Sibley & Sajovec

[57] ABSTRACT

A silicide layer is formed on a conductive layer in a microelectronic device by forming a first silicide layer on the conductive layer. A second silicide layer is then formed on the first silicide layer, the second silicide layer having a concentration of silicon that is less than the first silicide layer. Preferably, the first silicide layer and the second silicide layer are formed of tungsten silicide. The first silicide layer and the second silicide layer are preferably annealed to form a merged silicide layer. According to another aspect, a contact structure for contacting a microelectronic layer in a microelectronic device is formed by forming an insulation layer on the microelectronic layer, the insulation layer having a contact hole therethrough that exposes a portion of the microelectronic layer. A conductive layer is then formed on the insulation layer, the conductive layer extending through the contact hole to contact the exposed portion of the microelectronic layer. A first silicide layer is then formed on the conductive layer. A second silicide layer is formed on the first silicide layer, the second silicide layer having a lower concentration of silicon than the first silicide layer. A second insulation layer may then be formed on the second silicide layer, and the first silicide layer and the second silicide layer may be annealed to form a merged silicide layer.

11 Claims, 2 Drawing Sheets

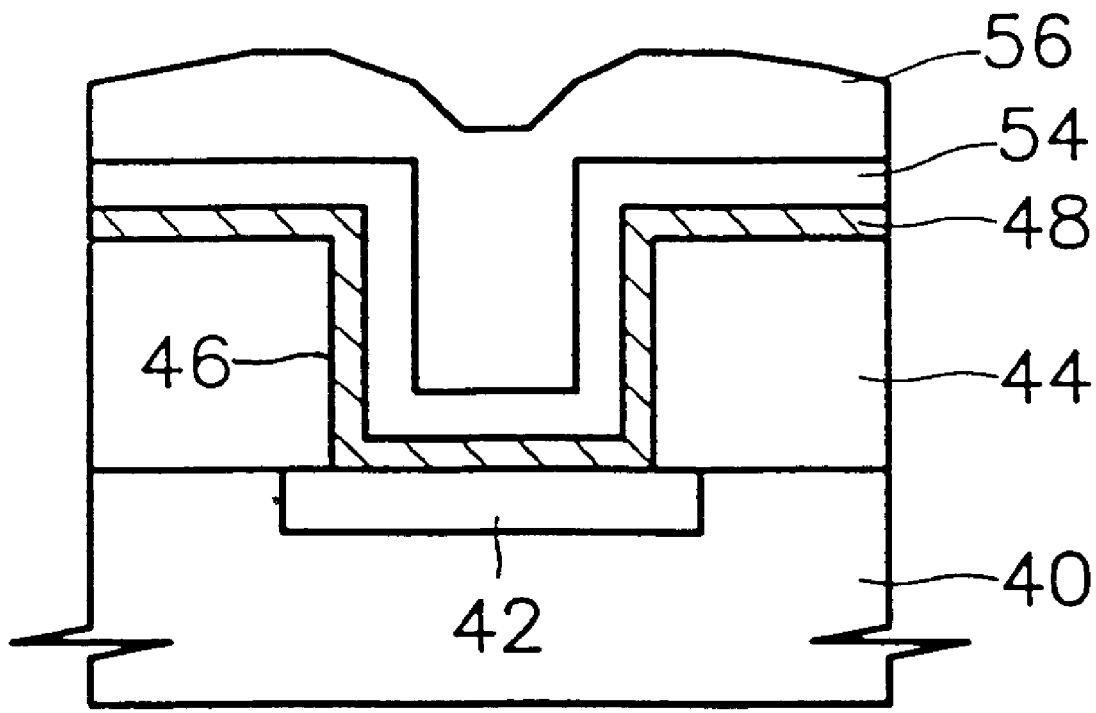

METHODS OF FABRICATING SILICIDE LAYERS AND SILICIDE CONTACT STRUCTURES IN MICROELECTRONIC DEVICES

FIELD OF THE INVENTION

The present invention relates to methods of fabricating microelectronic devices, and more particularly, to methods of fabricating suicide layers and contact structures in microelectronic devices.

BACKGROUND OF THE INVENTION

Generally, the electrical resistance of a microelectronic structure such as a word line, bit line or conductive plug varies according to the materials from which the structure is formed, the cross-sectional area of the structure and the length thereof. As microelectronic devices become more highly integrated, structures such as conductive lines generally have a smaller cross-sectional area and contact other microelectronic structures at smaller contact areas, thereby increasing electrical resistance. Consequently, signal transmission may be delayed, which may in turn reduce the operating speed of the device. To prevent such delay, the cross-sectional area of the conductive line or the contact area may be increased, but increasing cross-sectional area of the conductor or increasing the contact area can limit the density of the layout of the device.

A conventional approach to decreasing electrical resistance of a conductor in a device is to utilize a conductive structure including a tungsten silicide layer with a resistance of approximately 400 $\Omega/cm^2$ to 60 $\Omega/cm^2$. As illustrated in FIG. 1, a contact area 12 is defined on a semiconductor substrate 10. Conductive impurities may be implanted into the substrate 10 at the contact area 12, in order to lower the potential barrier between the contact area 12 and a conductive layer formed on the contact area 12. An element, such as transistor, may be formed on or in the semiconductor substrate 10 at the contact area 12.

A first insulation layer 14 is then formed on the entire surface of the semiconductor substrate 10. A contact hole 16 is formed in the first insulation layer 14, exposing the contact area 12. Residues generated during formation of the contact hole 16 are then removed, and a conductive layer 18, typically an impurity-doped polycrystalline silicon (polysilicon) layer is formed, covering the first insulation layer 14 and the exposed area of the contact area 12. A tungsten silicide layer 20 is then formed on the conductive layer 18. As shown in FIG. 2, a second insulation film 22 is formed on the tungsten silicide layer 20. The resultant structure is then annealed to thermally stabilize the structure.

The thermal expansion coefficient of the tungsten silicide layer 20 generally is greater than that of the impurity-doped polysilicon used for the conductive layer 18. Consequently, during the annealing process the expansion force generated by the tungsten silicide layer 20 is typically greater than that generated by the conductive layer 18, causing stress in the tungsten silicide layer 20. The stress may cause lifting at portions 26 of the interface between the conductive layer 18 and the tungsten silicide layer 20.

Conventional techniques for preventing this lifting include drying wafers under a vacuum for an extended period after the silicide layer is formed. However, even with extensive drying and vacuum evacuation, monitoring may be required after annealing to determine whether lifting has occurred. Monitoring typically requires sampling of a large number of wafers, leading to the sacrifice of a significant number of wafers. Consequently, conventional techniques for formation of silicide structures may reduce productivity of fabrication processes for microelectronic devices incorporating the structures.

SUMMARY OF THE INVENTION

In light of the foregoing, it is an object of the present invention to provide methods of fabricating silicide structures that are less prone to stress-induced lifting and similar defects.

This and other objects, features and advantages are provided according to the present invention by methods of forming silicide layers and silicide contact structures in which first and second silicide layers are sequentially formed, the first silicide layer being an adhesion layer having a greater silicon concentration than the second silicide layer. Preferably, the first and second silicide layers are formed of tungsten silicide. The first silicide layer is preferably formed by tungsten silicide deposition using a source gas include silane and $WF_6$ at a mixing ration of 400:1 or less. The sequentially formed silicide layers may be annealed to form a merged suicide layer which may be used as a word line, bit line, contact plug or the like.

In particular, according to the present invention, a first silicide layer is formed on a conductive layer in a microelectronic device. A second silicide layer is then formed on the first silicide layer, the second silicide layer having a lower silicon concentration than the first silicide layer. Preferably, the first silicide layer and the second silicide layer are formed of tungsten silicide. The first silicide layer preferably is formed to a thickness in a range of 200 Å to 300 Å. The first silicide layer preferably is formed by depositing a tungsten silicide layer using a source gas including silane and $WF_6$ at a mixing ratio of 400:1 or less. The first silicide layer and the second silicide layer are preferably annealed to form a merged silicide layer.

According to another aspect of the present invention, a contact structure for contacting a microelectronic layer in a microelectronic device is formed by forming an insulation layer on the microelectronic layer, the insulation layer having a contact hole therethrough that exposes a portion of the microelectronic layer. A conductive layer is then formed on the insulation layer, the conductive layer extending through the contact hole to contact the exposed portion of the microelectronic layer. A first silicide is then formed on the conductive layer. A second silicide layer having a lower silicon concentration than the first silicide layer is then formed on the first silicide layer. A second insulation layer may then be formed on the second silicide layer, and the first silicide layer and the second silicide layer may be annealed to form a merged silicide layer.

BRIEF DESCRIPTION OF THE DRAWINGS

FIGS. 3 and 4 are cross-sectional views of intermediate fabrication products illustrating operations for forming a silicide layer in a microelectronic device according to an embodiment of the present invention.

DETAILED DESCRIPTION OF PREFERRED EMBODIMENTS

Figure 1:
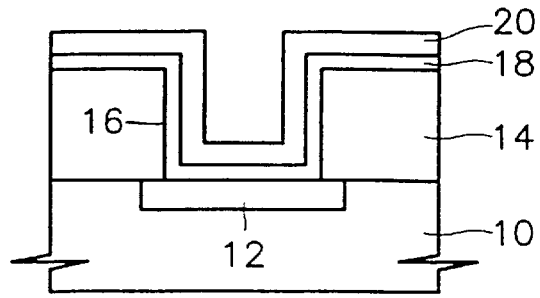
FIGS. 1 and 2 are cross-sectional views of intermediate fabrication products illustrating a conventional technique for forming a silicide layer.
Figure 2:
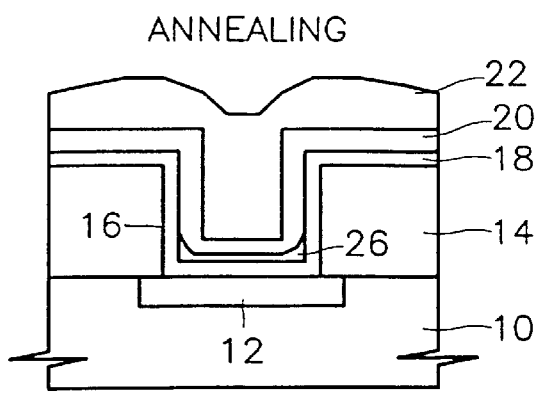

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. It will also be understood that when a layer is referred to as being "on" another layer or substrate, it can be directly on the other layer or substrate, or intervening layers may also be present.

a result of the annealing, the adhesion layer 50 and the second silicide layer 52 merge, forming a suicide layer 54 between the second insulation layer 56 and the conductive layer 48, as shown in FIG. 4. The merged silicide layer 54 may be used, for example, as a bit line, word line or interconnection line.

An exemplary embodiment of the present invention will now be discussed in detail with reference to Table 1:

TABLE 1

| Parameter | Heating | First SiH$_4$ Flushing | Deposition of silicide adhesion layer | Deposition of second silicide layer | Second SiH$_4$ Flushing | Vacuum Evacuation |
|---|---|---|---|---|---|---|
| time (sec) | 60 | 10 | 20 | 73 | 10 | 20 |
| pressure (mTorr) | 700 | 300 | 300 | 300 | 300 | 0 |
| BAr (sccm) | 30 | 30 | 30 | 30 | 30 | |
| SiH$_4$ Ar (sccm) | 50 | | | | | |
| WF$_6$ Ar (sccm) | 70 | 200 | 200 | 200 | 200 | |
| SiH$_4$ (sccm) | | 400 | 400 | 400 | 400 | |
| WF$_6$ (sccm) | | 3* | 1 | 3 | | |

Figure 3:
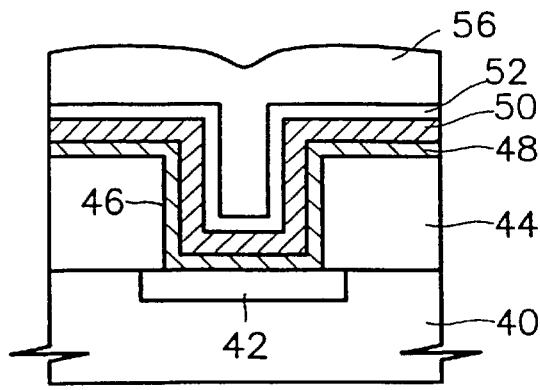

Referring to FIG. 3, impurities may be implanted at a contact area 42 of a substrate 40. The implantation at the contact area 42 can lower a potential barrier between a conductive material formed on this area and the substrate 40. Subsequently, a first insulation layer 44 is formed on semiconductor substrate 40, covering the contact area 42. The first insulation layer 44 is then patterned using, for example, photolithographic and anisotropic etching techniques, to expose a portion of the contact area 42 through a contact hole 46.

A conductive layer 48 is then formed on the resultant structure, covering the exposed portion of the contact area 42 and the first insulation layer 44. Preferably, the conductive layer 48 is formed of doped polycrystalline silicon (polysilicon), but those skilled in the art will appreciate that the conductive layer 48 may be formed of other conductive materials. Preferably, the conductive material used to form the conductive layer 48 has a thermal expansion coefficient similar to that of a silicide layer which is to be formed thereon as described in greater detail below, and forms a low potential barrier at the interface with the contact area 42.

An adhesion layer 50, preferably a first silicide layer having a thickness of 200 Å–300 Å, is then formed on the conductive layer 48. Preferably, the adhesion layer 50 is formed of a silicon-rich tungsten silicide containing more silicon than a typical tungsten silicide layer. In order to make a silicon-enriched first silicide layer, the layer may be formed using a source gas mixture of silane (SiH$_4$) and WF$_6$ gases at a mixing ratio of silane gas to WF$_6$ gases which is maintained at 200:1 or less, more preferably, 400:1 or less.

A second silicide layer 52 is then formed on the adhesion layer 50. The second silicide layer 52 preferably is formed of tungsten silicide having a lower concentration of silicon than the material of the silicide adhesion layer 50. The adhesion layer 50 and the second silicide layer 52 may be formed by an in-situ method. The adhesion layer 50 can help increase adhesion between the conductive layer 48 and the second silicide layer 52, and thus may decrease stress in the silicide layer 52. Preferably, the formation of the adhesion layer 50 does not affect the resistivity of the second silicide layer 52.

A second insulation layer 56 is then formed on the second silicide layer 52, and the resultant structure is annealed. As As shown in Table 1, a substrate having a doped polysilicon layer formed thereon was heated to a temperature suitable to stabilize the surface of the substrate. A first silane flushing was then performed by flowing silane gas on the doped polysilicon layer to form silicon (Si) seeds thereon. A silicon-rich tungsten silicide adhesion layer (a first silicide layer) was then formed on the doped polysilicon layer, at a mixing ratio of silane to WF$_6$ of approximately 400:1. A second silicide layer having a lower concentration of silicon was then formed on the adhesion layer. A second silane flushing was then performed on the second silicide layer to make the state of the second silicide layer similar to that of the adhesion layer and thereby reduce stress in the second silicide layer. A vacuum was then induced in the reaction chamber to exhaust gases remaining therein. After annealing to merge the silicide layers into a single layer, the resultant structure exhibited little or no lifting between the doped polysilicon layer and the merged silicide layer.

According to the present invention, a merged silicide layer is formed by annealing sequentially formed silicide layers including a first silicon-rich silicide layer and a second silicide layer having a lower concentration of silicon than the adhesion layer (a first silicide layer). The silicon-rich silicide layer acts as an adhesion layer, helping to prevent lifting at an interface between the merged silicide layer and an underlying layer. The structure thus formed can provide improved contact with more uniform sheet resistance, without requiring extensive time for vacuum evacuation and post-production monitoring for defects.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of fabricating a silicide layer on a conductive layer in a microelectronic device, the method comprising the steps of:
    reacting silane and tungsten hexafluoride at a mixing ratio in a range from 200:1 and to 400:1 to form a first tungsten silicide layer on the conductive layer; and
    forming a second tungsten silicide layer on the first tungsten silicide layer, the second tungsten silicide layer having a lower concentration of silicon than the first tungsten silicide layer.

2. A method according to claim 1, wherein said step of reacting comprises the step of reacting silane and tungsten silicide to form the first tungsten silicide layer to a thickness in a range of 200 Å to 300 Å.

3. A method according to claim 1, where said step of reacting and said step of forming a second tungsten silicide layer are performed in situ.

4. A method according to claim 1, wherein said step of forming a second tungsten silicide layer is followed by the step of annealing the first tungsten silicide layer and the second tungsten silicide layer to form a merged tungsten silicide layer.

5. A method of fabricating a contact structure for contacting a microelectronic layer in a microelectronic device, the method comprising the steps of:

forming an insulation layer on the microelectronic layer, the insulation layer having a contact hole therethrough that exposes a portion of the microelectronic layer;

forming a conductive layer on the insulation layer that extends through the contact hole to contact the exposed portion of the microelectronic layer;

forming a first silicide layer on the conductive layer; and forming a second silicide layer on the first silicide layer, the second silicide layer having a lower concentration of silicon than the first silicide layer.

6. A method according to claim 5:

wherein said step of forming a first silicide layer comprises the step of forming a first tungsten suicide layer; and wherein said step of forming a second silicide layer comprises the step of forming a second tungsten silicide layer.

7. A method according to claim 6, wherein said step of forming a first tungsten silicide layer comprises the step of forming a tungsten silicide layer to a thickness in a range of 200 Å to 300 Å.

8. A method according to claim 5, where said steps of forming a first silicide layer and forming a second silicide layer are performed in situ.

9. A method according to Claim,8, wherein said step of forming a first tungsten silicide layer comprises the step of depositing a tungsten silicide layer using a source gas including silane and $WF_6$ at a mixing ratio of 400:1 or less.

10. A method according to claim 5, wherein said step of forming a second silicide layer is followed by the step of annealing the first silicide layer and the second silicide layer to form a merged silicide layer.

11. A method according to claim 10, wherein said step of annealing is preceded by the step of forming a second insulation layer on the second silicide layer.

* * * * *